(12) United States Patent
Kanev et al.

(10) Patent No.: US 11,287,475 B2
(45) Date of Patent: Mar. 29, 2022

(54) METHOD FOR COMPENSATING TO DISTANCE BETWEEN PROBE TIP AND DEVICE UNDER TEST AFTER TEMPERATURE CHANGES

(71) Applicant: MPI Corporation, Hsinchu County (TW)

(72) Inventors: Stojan Kanev, Hsinchu County (TW); Yu-Hsun Hsu, Hsinchu County (TW); Chien-Hung Chen, Hsinchu County (TW)

(73) Assignee: MPI CORPORATION, Hsinchu County (TW)

( * ) Notice: Subject to any disclaimer, the term of this patent is extended or adjusted under 35 U.S.C. 154(b) by 31 days.

(21) Appl. No.: 16/892,267

(22) Filed: Jun. 3, 2020

(65) Prior Publication Data

US 2021/0382108 A1    Dec. 9, 2021

(51) Int. Cl.
*G01R 31/319* (2006.01)
*G01K 7/01* (2006.01)
(Continued)

(52) U.S. Cl.
CPC ......... *G01R 31/31905* (2013.01); *G01C 3/02* (2013.01); *G01K 7/01* (2013.01); *G01R 31/2874* (2013.01); *G01R 31/2886* (2013.01)

(58) Field of Classification Search
CPC ............ G01R 31/2891; G01R 1/07342; G01R 31/2886; G01R 31/2887; G01R 1/06711; G01R 1/07357; G01R 1/06727; G01R 31/002; G01R 31/2851; G01R 1/025; G01R 27/02; G01R 27/06; G01R 31/11; G01R 31/26; G01R 35/00; G01R 31/00; G01R 31/287; G01R 31/2601; G01R 23/20; G01R 31/001; G01R 31/2863; G01R 31/2867; G01R 31/2808; G01R 31/2806; G01R 1/06794; G01R 1/44; G01R 19/0046; G01R 31/2874; G01R 31/2656; G01R 31/2893; G01R 31/303; G01R 31/31717;
(Continued)

(56) References Cited

U.S. PATENT DOCUMENTS

5,640,101 A * 6/1997 Kuji ................... G01R 31/2887
324/756.03
6,710,798 B1 * 3/2004 Hershel ............. G01R 31/2887
324/750.23
(Continued)

*Primary Examiner* — Vinh P Nguyen
(74) *Attorney, Agent, or Firm* — CKC & Partners Co., LLC (57) ABSTRACT

A method for compensating to a first distance between a probe tip and a device under test (DUT) after a temperature change of the DUT includes: capturing a first image having the probe and its reflected image on a reflective surface of the DUT at a first temperature; measuring a second distance between a reference point of the probe and its reflected image; changing the first temperature of the DUT to a second temperature; capturing a second image having the probe and its reflected image on the reflective surface at the second temperature; measuring a third distance between the reference point of the probe and its reflected image; dividing the difference between the third and the second distances by two to obtain a fourth distance; and determining a relative position between the probe and the DUT by the fourth distance to compensate to the first distance.

7 Claims, 6 Drawing Sheets

(51) Int. Cl.
*G01C 3/02* (2006.01)
*G01R 31/28* (2006.01)

(58) Field of Classification Search
CPC .... G06F 30/33; G06F 3/0416; G06F 2119/12; H04N 17/002; H04N 5/23254; H04N 5/23227; H04N 5/23206; H04N 5/247; H04N 19/136; H04N 7/181; H04N 7/183; H04L 12/2885; G01B 21/045; G01B 5/0014; G01B 11/002; G01B 11/03; G01B 11/14; G01B 11/26; G01B 5/008; G01B 11/005; G01B 11/02; G01B 21/30; G01B 7/023; G01B 9/0201; G01B 9/02072; G01B 11/00; G01B 11/0608; G01B 11/0625; G01B 11/2433; G01B 11/2441; G01B 11/2504; G01B 11/306; G01B 11/303; G01B 11/30; G01B 5/02; G01B 3/008; H04B 3/46; G06T 7/75; G06T 7/77; G06T 15/20; G06T 2207/30148; G06T 17/20; G06T 7/001; G06T 7/0014; G06T 7/30; G06T 7/55; G06T 7/50; G06T 7/60; G06T 9/00; G06T 7/0004; G06T 7/0002; G06T 2207/30108; G06T 2207/30241; G06T 7/20; G01D 21/00; G01D 5/262; G01D 5/268; G01K 13/02; G01K 17/00; G01K 17/06; G01K 1/16

See application file for complete search history.

(56) References Cited

U.S. PATENT DOCUMENTS 7,173,245 B2 * 2/2007 Shakouri .................. G01J 5/00
250/339.1
9,804,196 B2 * 10/2017 Bolt .................. G01R 31/2891
10,877,070 B2 * 12/2020 Frankel .................. G01R 1/08

* cited by examiner

METHOD FOR COMPENSATING TO DISTANCE BETWEEN PROBE TIP AND DEVICE UNDER TEST AFTER TEMPERATURE CHANGES

BACKGROUND

Technical Field

The present disclosure relates to methods for compensating to a distance between a probe tip and a device under test after a temperature change. More particularly, the present disclosure relates to probes installed at wafer probe stations.

Description of Related Art

As the demand for electronic devices has been increasing nowadays, the quality of the components of the electronic devices correspondingly becomes an important issue of the semiconductor industry. Apart from the improving technology of manufacture for the components, the accuracy of testing for the components has also become more important.

For example, wafer probe stations are in general used to test the quality of the wafers or dies in the semiconductor industry. Hence, the operational accuracy of wafer probe stations is undoubtedly concerned.

SUMMARY

A technical aspect of the present disclosure is to provide a method for determining a probe tip position after a temperature change, which can accurately determine the distance between the tip of the probe and the device under test after the temperature of the wafer probe station is increased or decreased.

According to an embodiment of the present disclosure, a method for compensating to a first distance between a tip of a probe and a device under test after a temperature change of the device under test is provided. The method includes: providing a reflective surface on the device under test; capturing by an image taking device a first image having the probe and a reflected image of the probe on the reflective surface at a first temperature; measuring a second distance between a reference point of the probe and the reflected image of the reference point in the first image; changing the first temperature of the device under test to a second temperature; capturing by the image taking device a second image having the probe and the reflected image of the probe on the reflective surface at the second temperature; measuring a third distance between the reference point of the probe and the reflected image of the reference point in the second image; dividing the difference between the third distance and the second distance by two to obtain a fourth distance; and determining a relative position between the probe and the device under test by the fourth distance to compensate to the first distance between the tip of the probe and the device under test after the device under test is changed to the second temperature.

In one or more embodiments of the present disclosure, the procedure of determining the relative position between the probe and the device under test by the fourth distance to compensate to the first distance includes moving the probe relative to the device under test by the fourth distance.

In one or more embodiments of the present disclosure, the procedure of determining the relative position between the probe and the device under test by the fourth distance to compensate to the first distance includes moving the device under test relative to the probe by the fourth distance.

In one or more embodiments of the present disclosure, the procedure of determining the relative position between the probe and the device under test by the fourth distance to compensate to the first distance includes moving respectively the probe and the device under test such that the relative position between the probe and the device under test is changed by the fourth distance.

In one or more embodiments of the present disclosure, a direction along which the image taking device captures the first image and the second image is nearly in parallel with the reflective surface.

In one or more embodiments of the present disclosure, the reference point is a visually clear point observed by the image taking device.

In one or more embodiments of the present disclosure, the reference point is a mark on the probe.

In one or more embodiments of the present disclosure, the fourth distance is substantially perpendicular to the reflective surface.

In one or more embodiments of the present disclosure, the device under test is a wafer.

In one or more embodiments of the present disclosure, the device under test is a chuck.

When compared with the prior art, the above-mentioned embodiments of the present disclosure have at least the following advantages:

(1) When the temperature of the device under test is either increased or decreased, the distance between the tip of the probe and the device under test can be accurately compensated in an easy and simple manner, which is convenient and efficient to the user.

(2) Since the distance between the reference points of the probes at different temperatures is a half of the difference between the distances as measured between the reference points and the reflected images of the reference points at different temperatures, the error in the measurements of the distances can be reduced and thus the accuracy of the distance obtained between the reference points of the probes at different temperatures is increased.

BRIEF DESCRIPTION OF THE DRAWINGS

The disclosure can be more fully understood by reading the following detailed description of the embodiments, with reference made to the accompanying drawings as follows.

DETAILED DESCRIPTION

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
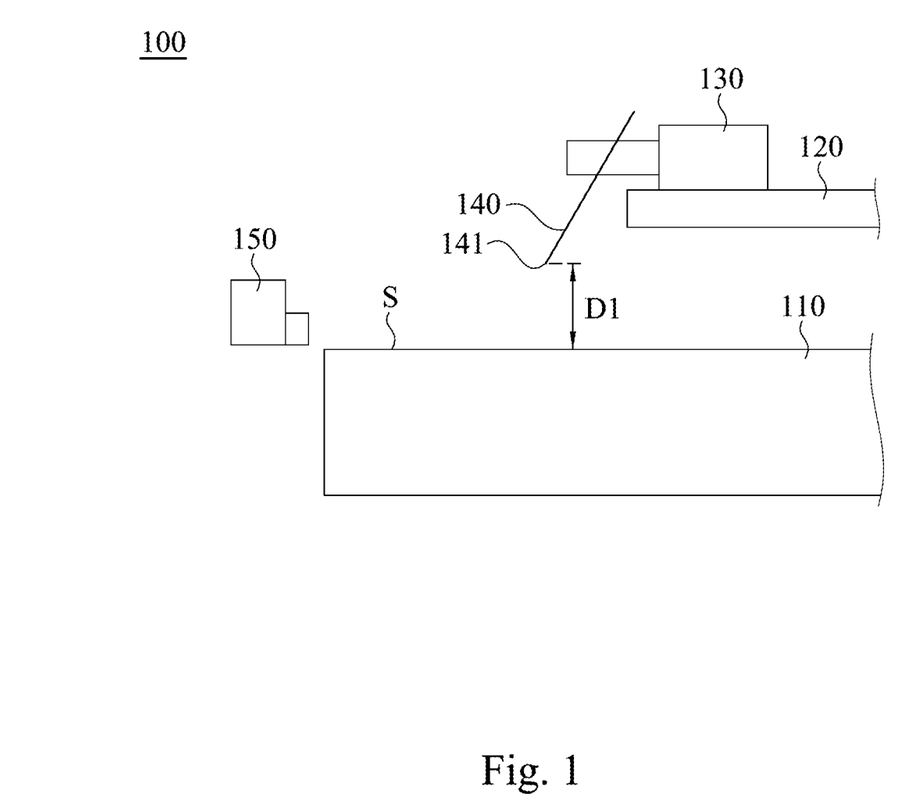
FIG. 1 is a schematic view of a wafer probe station according to an embodiment of the present disclosure.

Reference is made to FIG. 1. FIG. 1 is a schematic view of a wafer probe station 100 according to an embodiment of the present disclosure. In this embodiment, as shown in FIG. 1, a wafer probe station 100 includes a chuck 110, a platen 120, a probe holder 130, at least one probe 140 and an image taking device 150. The chuck 110 is practically rotatable and movable three dimensionally. The chuck 110 is configured to hold a wafer 200 (please refer to FIG. 6 for the wafer 200). The platen 120 is disposed above the chuck 110 and the probe holder 130 is mounted on the platen 120. The probe 140 is held by the probe holder 130 such that the probe 140 is ready to be in contact with the device under test, which is the chuck 110 in this embodiment. For the sake of simplicity of the figure, other components of the wafer probe station 100 are not shown in FIG. 1.

Figure 2:
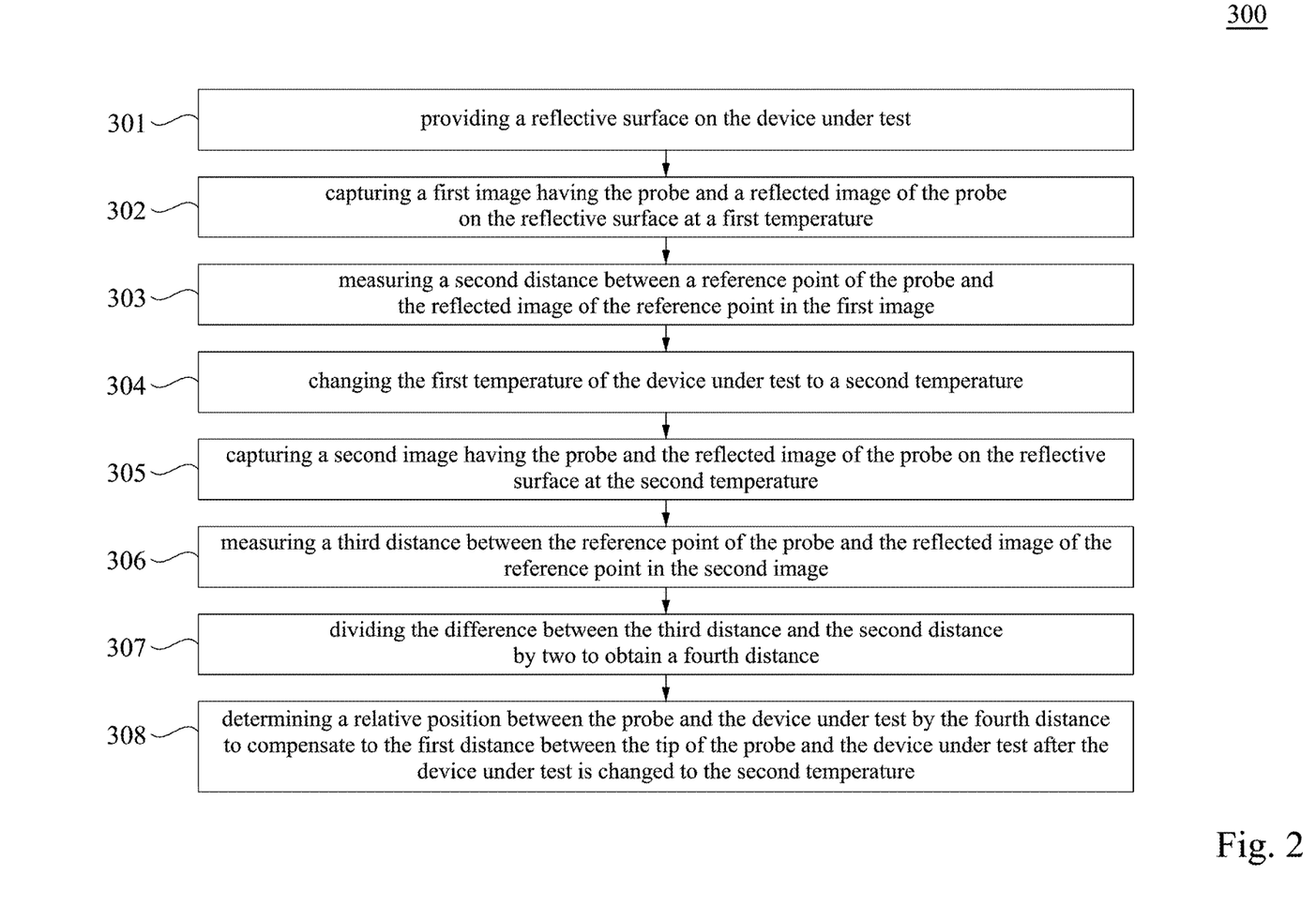
FIG. 2 is a flow diagram of a method for determining a position of a tip of the probe of FIG. 1 after a temperature change according to an embodiment of the present disclosure.

Reference is made to FIG. 2. FIG. 2 is a flow diagram of a method 300 for compensating to a distance D1 between a tip 141 of the probe 140 and the device under test (the chuck 110) of FIG. 1 after a temperature change according to an embodiment of the present disclosure. As shown in FIG. 2, in this embodiment, the method 300 includes the following steps (it should be noted that the sequence of the steps and the sub-steps as mentioned below, unless otherwise specified, can all be adjusted upon the actual needs, or even executed at the same time or partially at the same time):

(1) Providing a reflective surface S on the device under test (the chuck 110) (Step 301). The reflective surface S is practically a top surface of the device under test (the chuck 110) and is smooth enough to reflect an image. The reflective surface S of the device under test (the chuck 110) is configured to be in contact with the tip 141 of the probe 140 for subsequent testing.

Figure 3:
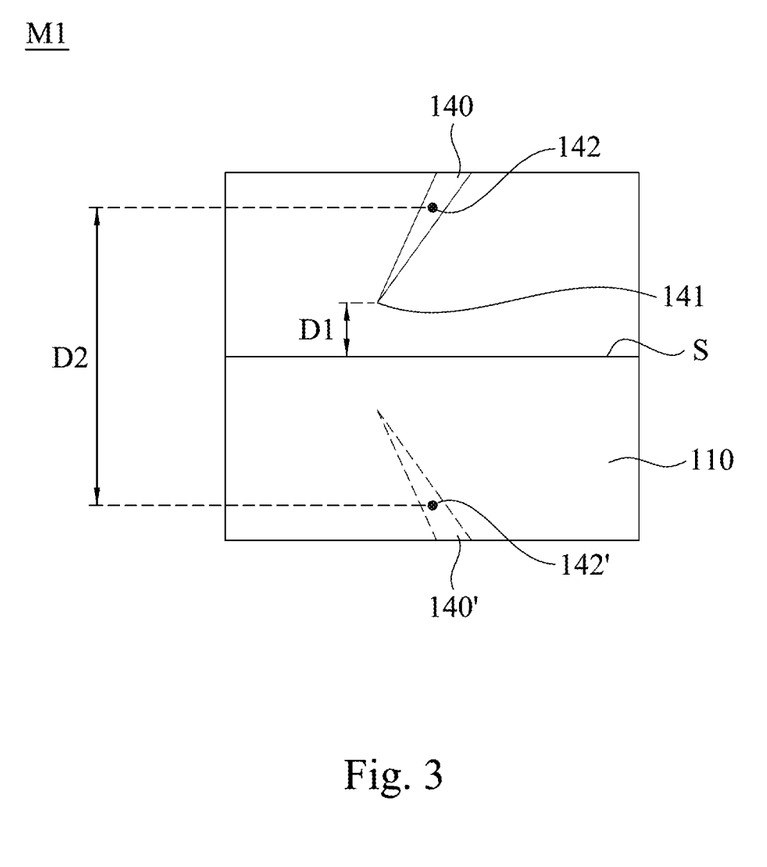
FIG. 3 is a graphic view of a first image captured by the image taking device of FIG. 1, in which the device under test is at the first temperature.

(2) Capturing by the image taking device 150 a first image M1 having the probe 140 and a reflected image 140' of the probe 140 on the reflective surface S at a first temperature T1 (Step 302). Reference is made to FIG. 3. FIG. 3 is a graphic view of a first image M1 captured by the image taking device 150 of FIG. 1, in which the device under test (the chuck 110) is at the first temperature T1. As shown in FIGS. 1 and 3, the distance D1 is the distance between the tip 141 of the probe 140 and the device under test (the chuck 110) at the first temperature T1. In practical applications, as shown in FIG. 1, the image taking device 150 is disposed close to the reflective surface S of the device under test (the chuck 110) and a direction along which the image taking device 150 captures an image is nearly in parallel with the reflective surface S. For example, the direction along which the image taking device 150 captures an image forms an included angle with the reflective surface S of the device under test (the chuck 110) by less than 1 degree. However, this does not intend to limit the present disclosure.

(3) Measuring a distance D2 between a reference point 142 of the probe 140 and the reflected image 142' of the reference point 142 in the first image M1 (Step 303). In this embodiment, the reference point 142 of the probe 140 is a visually clear point as observed by the image taking device 150. In other words, the reference point 142 can be clearly focused by the image taking device 150. In other embodiments, in practical applications, the reference point 142 is a mark on the probe 140, such that the mark can be clearly focused by the image taking device 150.

(4) Changing the first temperature T1 of the device under test (the chuck 110) to a second temperature T2 (Step 304). In practical applications, the second temperature T2 of the device under test (the chuck 110) is either increased or decreased relative to the first temperature T1. For example, the second temperature T2 can be as high as 300 degrees or as low as −60 degrees, depending on the actual situations. However, this does not intend to limit the present disclosure. For the sake of simplicity, the effect of the thermal expansion or the thermal contraction of other parts of the wafer probe station 100 surrounding the device under test (the chuck 110) is neglected.

Figure 4:
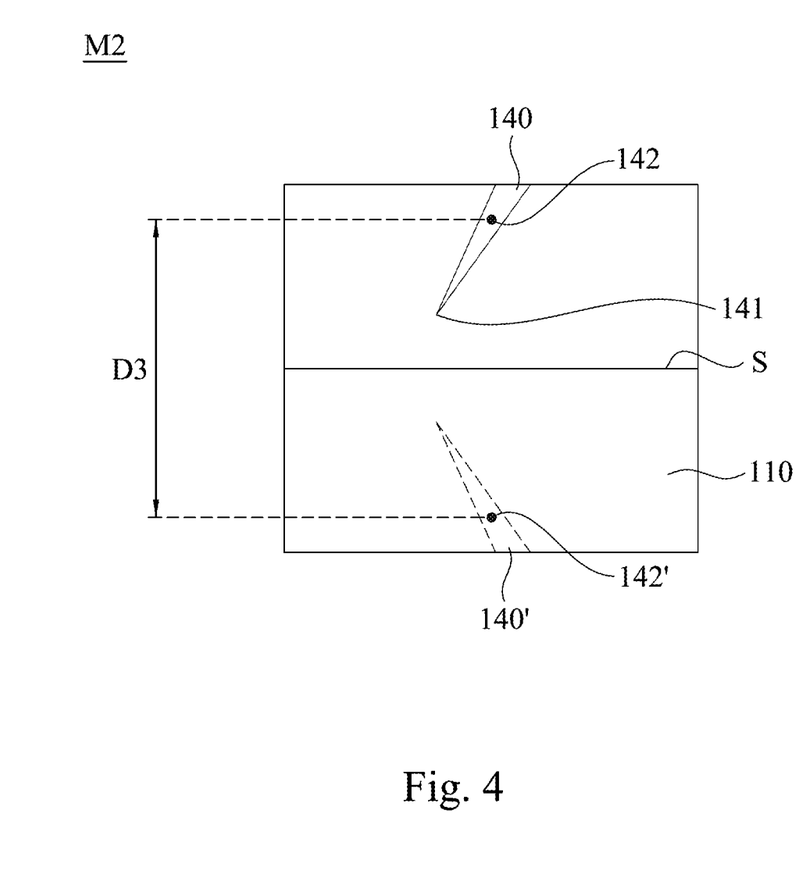
FIG. 4 is a graphic view of a second image captured by the image taking device of FIG. 1, in which the probe is at a third temperature and the device under test is at a fourth temperature.

(5) Capturing by the image taking device 150 a second image M2 having the probe 140 and the reflected image 140' of the probe 140 on the reflective surface S at the second temperature T2 (Step 305). Reference is made to FIG. 4. FIG. 4 is a graphic view of a second image M2 captured by the image taking device 150 of FIG. 1, in which the device under test (the chuck 110) is at the second temperature T2.

(6) Measuring a distance D3 between the reference point 142 of the probe 140 and the reflected image 142' of the reference point 142 in the second image M2 (Step 306). Due to the thermal expansion or the thermal contraction of the device under test (the chuck 110) at the second temperature T2, the location of the reference point 142 of the probe 140 relative to the device under test (the chuck 110) may be changed, such that the distance D3 between the reference point 142 of the probe 140 and the reflected image 142' of the reference point 142 in the second image M2 may be different from the distance D2 between the reference point 142 of the probe 140 and the reflected image 142' of the reference point 142 in the first image M1.

(7) Dividing the difference between the distance D3 and the distance D2 by two to obtain a distance D4 (Step 307). Please refer to FIG. 5 for the distance D4. In practice, the distance D4 is substantially perpendicular to the reflective surface S. Since the distance D4 is a half of the difference between the distance D3 and the distance D2 as measured, the error in the measurements of the distance D3 and the distance D2 can be reduced and thus the accuracy of the distance D4 obtained is increased.

Figure 5:
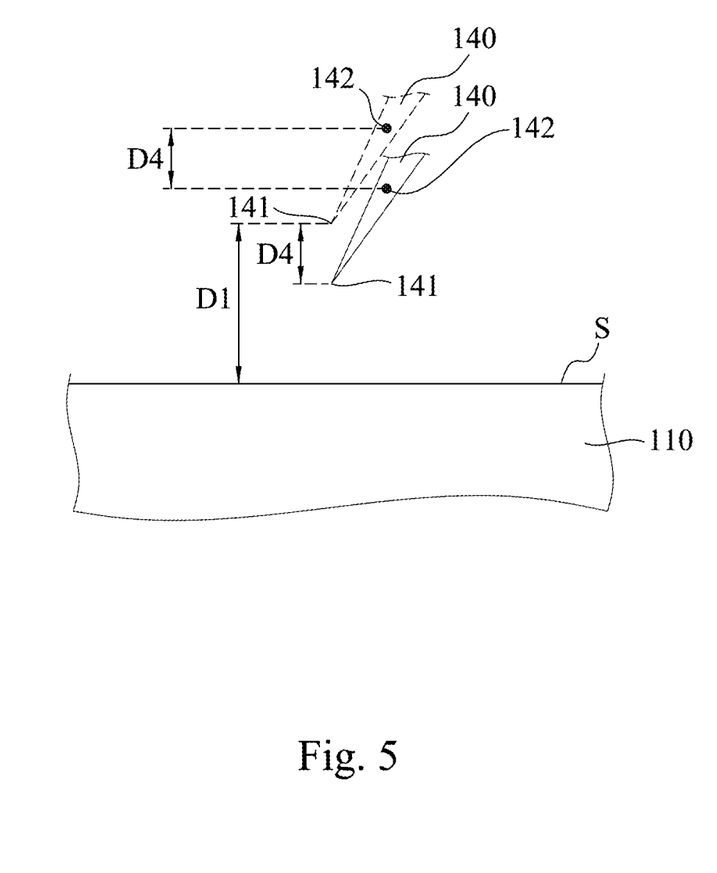
FIG. 5 is an enlarged view showing the relative positions of the probe relative to the reflective surface of the device under test at different temperatures.

(8) Determining a relative position between the probe 140 and the device under test (the chuck 110) by the distance D4 to compensate to the distance D1 between the tip 141 of the probe 140 and the device under test (the chuck 110) after the device under test (the chuck 110) is changed to the second temperature T2 (Step 308). Reference is made to FIG. 5. FIG. 5 is an enlarged view showing the relative positions of the probe 140 relative to the reflective surface S of the device under test (the chuck 110) at different temperatures. As shown in FIG. 5, the probe 140 with the device under test (the chuck 110) at the first temperature T1 is presented in hidden lines while the probe 140 with the device under test (the chuck 110) at the second temperature T2 is presented in solid lines. In the geometric point of view, the height difference between the tips 141 of the probes 140 in the hidden lines and in the solid lines is substantially equal to the distance D4, which is also the height difference of the reference point 142 of the probe 140 when the device under test (the chuck 110) is at the first temperature T1 and the second temperature T2. Thus, for example, by moving the probe 140 in solid lines by the distance D4 relative to the device under test (the chuck 110), the probe 140 in solid lines will go back to the position where the probe 140 in hidden lines is located. In other words, the distance between the tip 141 of the probe 140 and the device under test (the chuck 110) at the second temperature T2 is compensated as the distance D1.

In practice, in other to compensate to the distance D1 between the tip 141 of the probe 140 and the device under test (the chuck 110) after the device under test (the chuck 110) is changed to the second temperature T2, instead of moving the probe 140 in solid lines by the distance D4 relative to the device under test (the chuck 110) as mentioned above, the device under test (the chuck 110) can be moved relative to the probe 140 in solid lines by the distance D4. Moreover, according to the actual situation, both of the probe 140 in solid lines and the device under test (the chuck 110) can be moved respectively such that the relative position between the probe 140 in solid lines and the device under test (the chuck 110) is changed by the distance D4.

With regards to the procedures mentioned above, when the temperature of the device under test (the chuck 110) is either increased or decreased, the distance D1 between the tip 141 of the probe 140 and the device under test (the chuck 110) can be accurately compensated in an easy and simple manner, which is convenient and efficient to the user.

Figure 6:
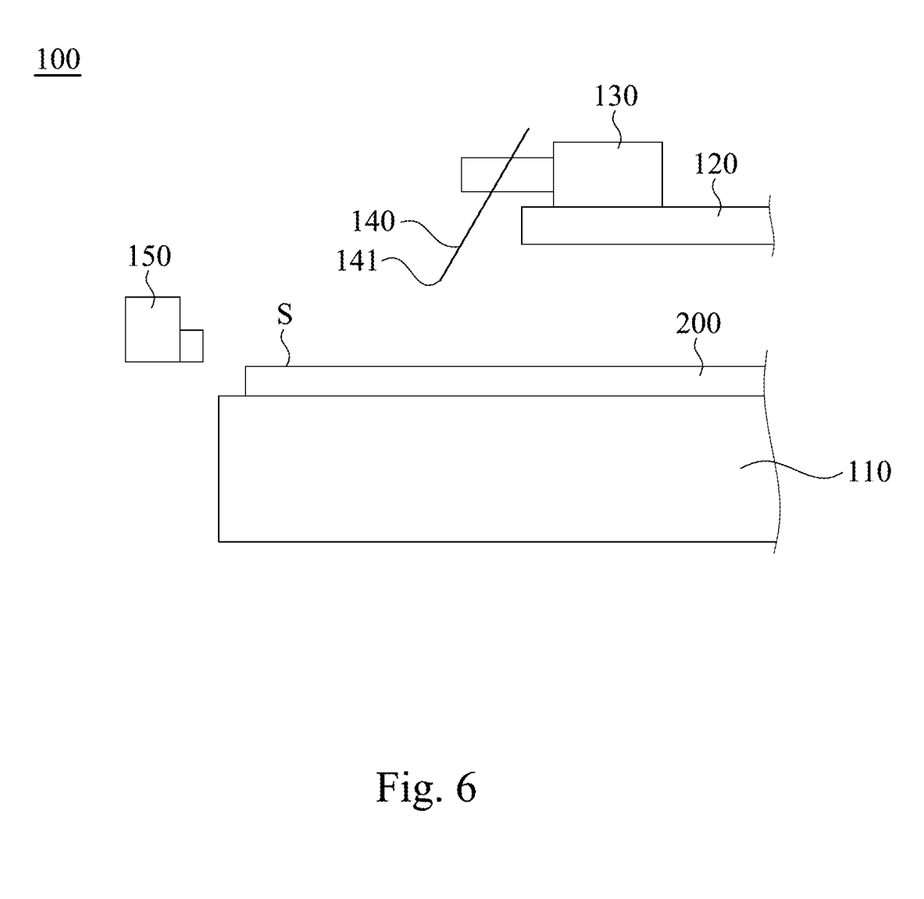
FIG. 6 is a schematic view of a wafer probe station according to another embodiment of the present disclosure.

Reference is made to FIG. 6. FIG. 6 is a schematic view of a wafer probe station 100 according to another embodiment of the present disclosure. In this embodiment, as shown in FIG. 6, the device under test is a wafer 200. In other words, the reflective surface S is practically a top surface of the wafer 200.

In conclusion, when compared with the prior art, the aforementioned embodiments of the present disclosure have at least the following advantages:

(1) When the temperature of the device under test is either increased or decreased, the distance between the tip of the probe and the device under test can be accurately compensated in an easy and simple manner, which is convenient and efficient to the user.

(2) Since the distance between the reference points of the probes at different temperatures is a half of the difference between the distances as measured between the reference points and the reflected images of the reference points at different temperatures, the error in the measurements of the distances can be reduced and thus the accuracy of the distance obtained between the reference points of the probes at different temperatures is increased.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A method for compensating to a first distance between a tip of a probe and a device under test after a temperature change of the device under test, the method comprising:
   providing a reflective surface on the device under test;
   capturing by an image taking device a first image having a probe image of the probe and a reflected image of the probe on the reflective surface at a first temperature;
   measuring a second distance between a reference point of the probe image and a corresponding reference point of the reflected image of the probe in the first image;
   changing the first temperature of the device under test to a second temperature;
   capturing by the image taking device a second image having the probe image of the probe and the reflected image of the probe on the reflective surface at the second temperature;
   measuring a third distance between the reference point of the probe image and the corresponding reference point of the reflected image of the probe in the second image; and
   moving at least one of the probe and the device under test by a fourth distance equal to half the difference between the third distance and the second distance to compensate to the first distance between the tip of the probe and the device under test after the device under test is changed to the second temperature.

2. The method of claim 1, wherein a direction along which the image taking device captures the first image and the second image is nearly in parallel with the reflective surface.

3. The method of claim 1, wherein the reference point is a visually clear point observed by the image taking device.

4. The method of claim 1, wherein the reference point is a mark on the probe.

5. The method of claim 1, wherein the fourth distance is substantially perpendicular to the reflective surface.

6. The method of claim 1, wherein the device under test is a wafer.

7. The method of claim 1, wherein the device under test is a chuck.

* * * * *